(12) United States Patent
Kawai

(10) Patent No.: US 9,928,871 B2
(45) Date of Patent: Mar. 27, 2018

(54) STORAGE DEVICE AND A METHOD FOR DEFECT SCANNING OF THE SAME

(71) Applicant: KABUSHIKI KAISHA TOSHIBA, Tokyo (JP)

(72) Inventor: Yasumasa Kawai, Yokohama Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 79 days.

(21) Appl. No.: 15/060,542

(22) Filed: Mar. 3, 2016

(65) Prior Publication Data

US 2017/0098463 A1 Apr. 6, 2017

Related U.S. Application Data

(60) Provisional application No. 62/235,734, filed on Oct. 1, 2015.

(51) Int. Cl.
| | | |
|---|---|---|
| *G11B 20/18* | (2006.01) | |
| *G11C 16/10* | (2006.01) | |
| *G11C 16/26* | (2006.01) | |
| *G11C 29/38* | (2006.01) | |

(52) U.S. Cl.
CPC ...... *G11B 20/1889* (2013.01); *G11B 20/1816* (2013.01); *G11C 16/10* (2013.01); *G11C 16/26* (2013.01); *G11C 29/38* (2013.01)

(58) Field of Classification Search
CPC ................ G11B 20/1883; G11B 20/1889
See application file for complete search history.

(56) References Cited

U.S. PATENT DOCUMENTS

| | | | | |
|---|---|---|---|---|
| 6,606,211 B1 * | 8/2003 | Lim | ................... | G11B 20/1816 360/31 |
| 6,728,060 B1 * | 4/2004 | Chng | ................... | G11B 5/5547 360/58 |
| 7,929,234 B1 * | 4/2011 | Boyle | ................ | G11B 20/1879 360/31 |
| 8,116,020 B1 * | 2/2012 | Lee | .................... | G11B 20/1883 360/31 |
| 2005/0018571 A1 | 1/2005 | Ijtsma et al. | | |
| 2006/0230328 A1 * | 10/2006 | Blacquiere | ......... | G11B 20/1883 714/763 |
| 2007/0217295 A1 * | 9/2007 | Ijtsma | ................ | G11B 20/1251 369/1 |

(Continued)

*Primary Examiner* — Steve Nguyen
(74) *Attorney, Agent, or Firm* — Patterson & Sheridan, LLP

(57) ABSTRACT

A defect scan method is carried out to detect a defective portion in a storage medium of a storage device, the storage medium including multiple storage regions including a first storage region and a second storage region. The defect scan method includes scanning a part of the storage regions of the storage medium to detect a defective portion therein, before the storage device is connected to a host, a scanned storage region including the first storage region and a non-scanned storage region including the second storage region, mapping logical addresses to physical addresses of a non-defective portion of the first storage region, scanning the second storage region to detect a defective portion therein, after the storage device is connected to the host, and mapping logical addresses to physical addresses of a non-defective portion of the second storage region.

14 Claims, 7 Drawing Sheets

(56) References Cited

U.S. PATENT DOCUMENTS

2008/0168315 A1\* 7/2008 Mead ................ G01R 33/1207
　　　　　　　　　　　　　　　　　714/49
2008/0209281 A1　 8/2008 Nagashima et al.
2008/0273437 A1\* 11/2008 Ijtsma .................... G11B 20/10
　　　　　　　　　　　　　　　　　369/59.25
2010/0328812 A1　12/2010 Ohhashi et al.

\* cited by examiner

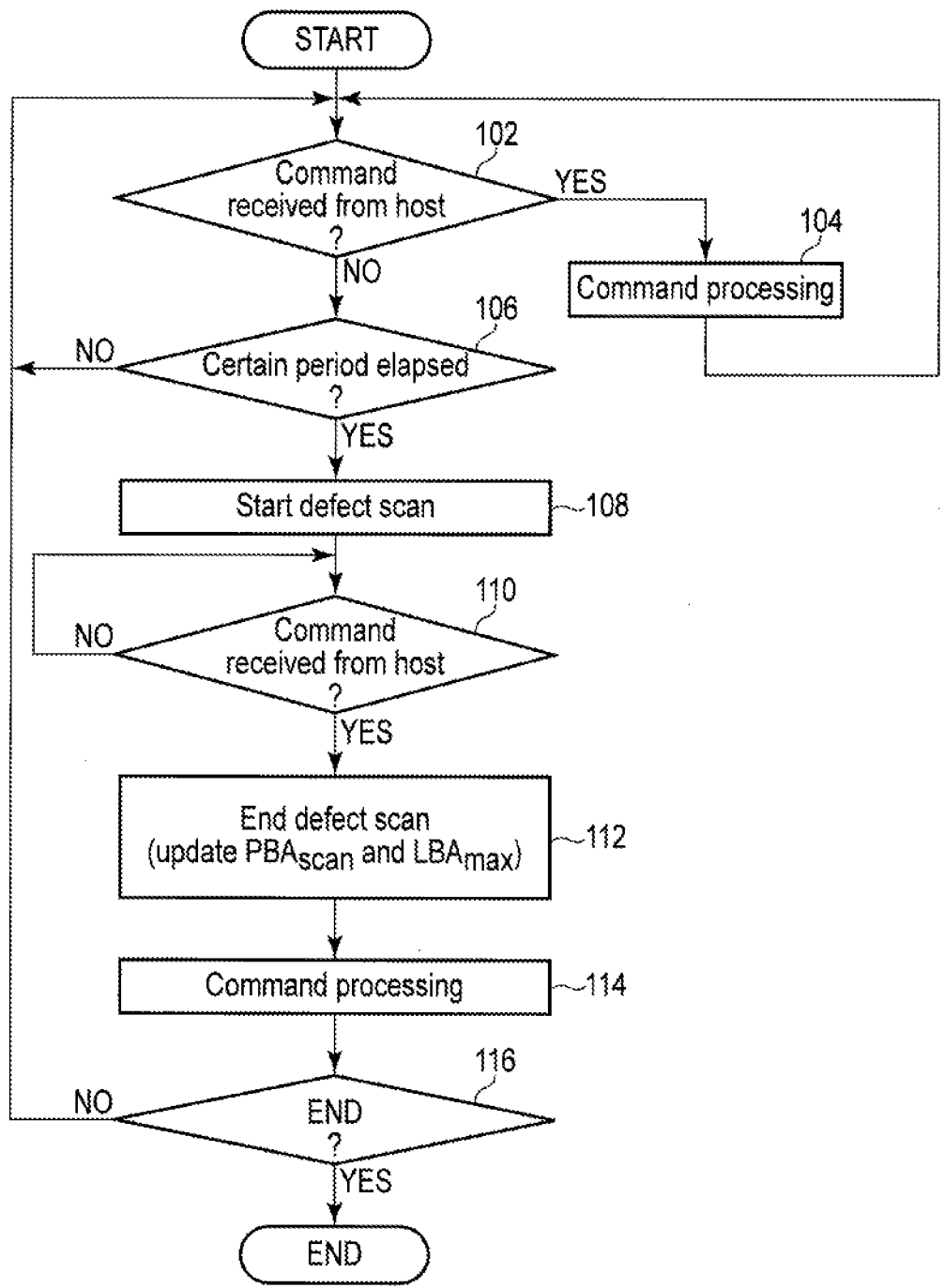
F I G. 3

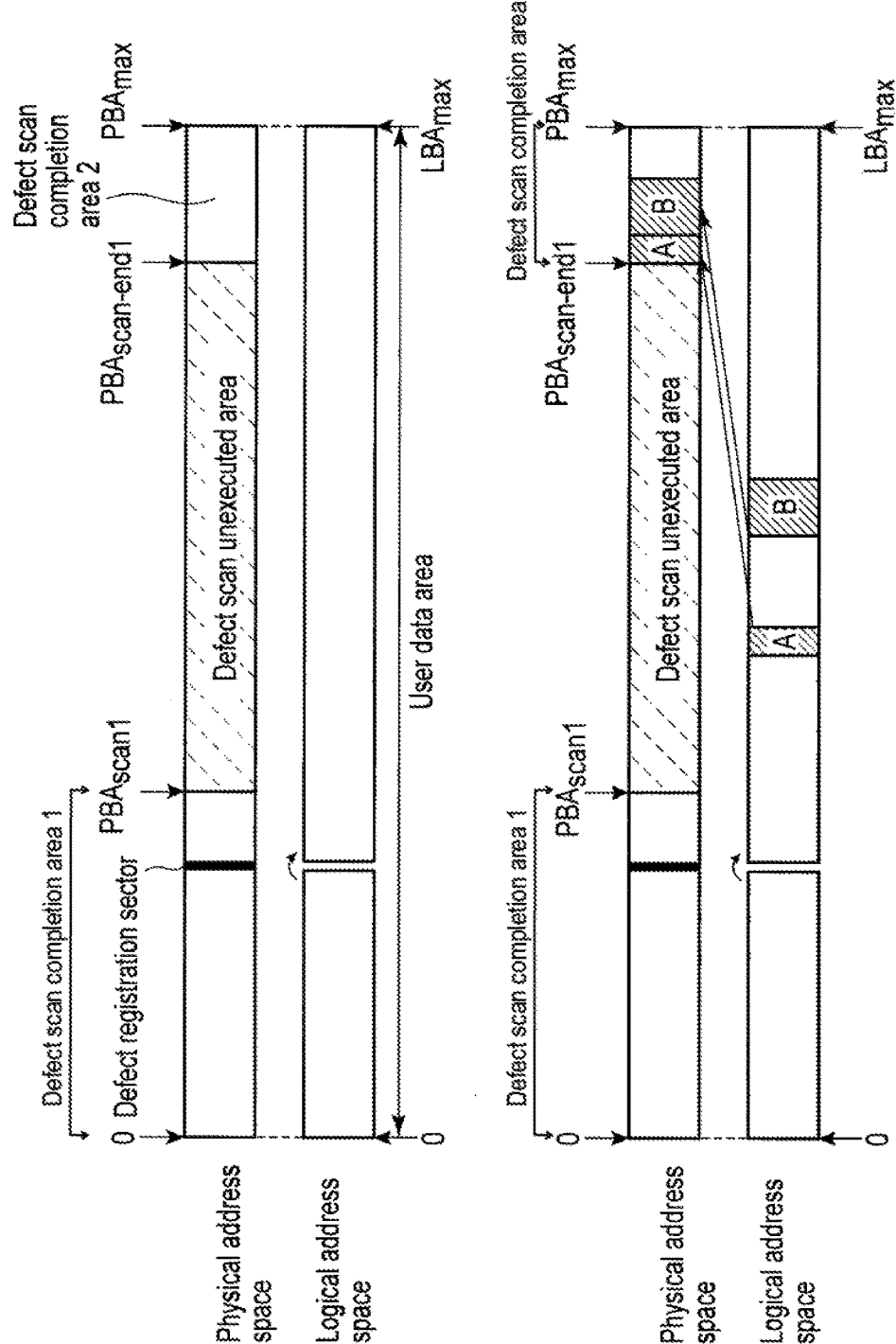
F I G. 5A
F I G. 5B

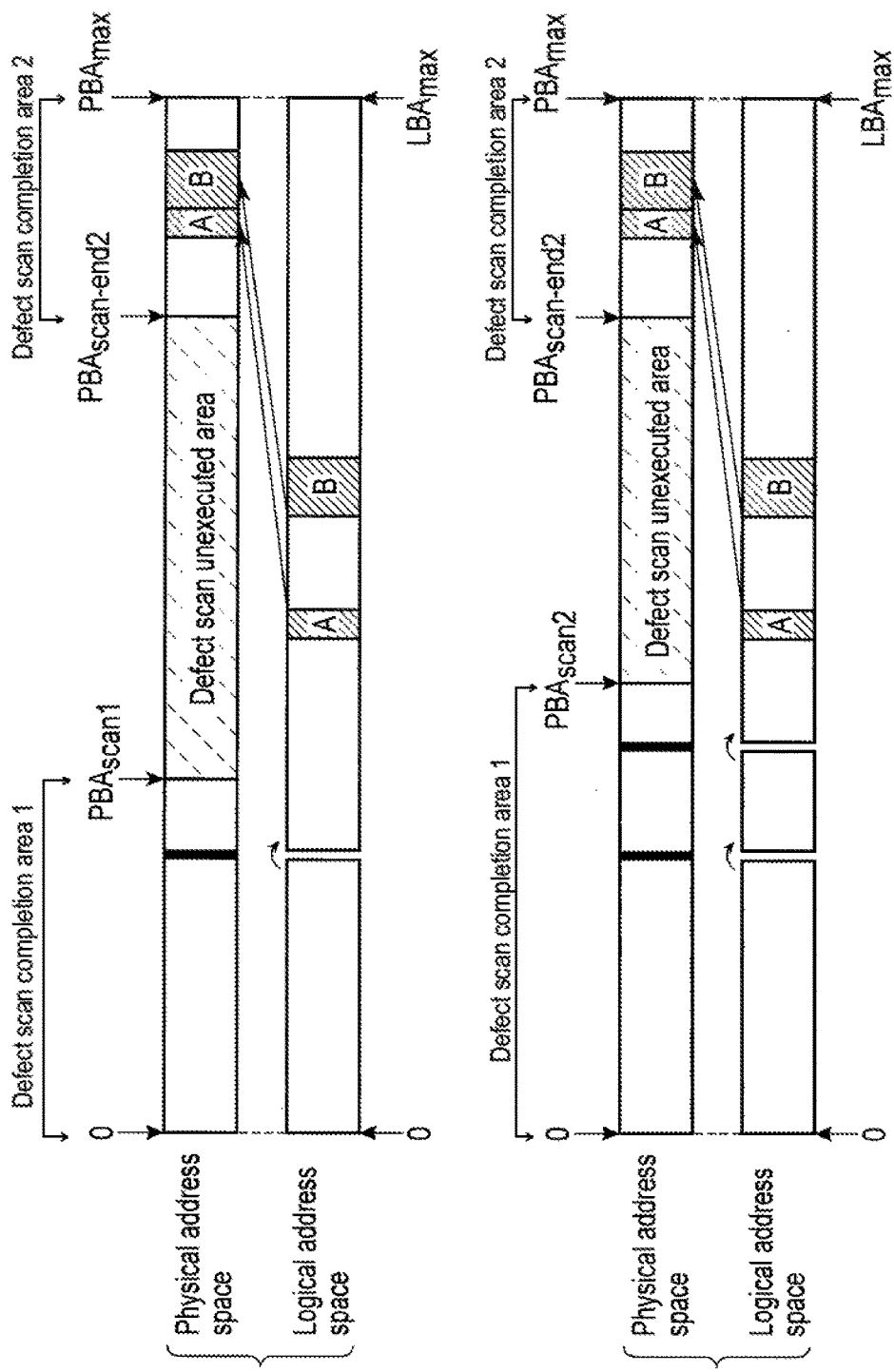

STORAGE DEVICE AND A METHOD FOR DEFECT SCANNING OF THE SAME

CROSS-REFERENCE TO RELATED APPLICATION

This application is based upon and claims the benefit of priority from Provisional Application No. 62/235,734, filed Oct. 1, 2015, the entire contents of which are incorporated herein by reference.

FIELD

Embodiments described herein relate generally to a storage device and a method for defect scanning of the same.

BACKGROUND

Defect scan is usually performed with respect to a storage device such as a hard disk drive or the like. The defect scan is an operation of writing data to a storage medium such as a magnetic disk, test whether the data can be normally read or not, and detect a defect sector in which data cannot be normally read due to a defect, such as a scratch on the medium, etc. A physical address of the defect sector is registered in a defect list and the defect sector is set to be unusable. To set the defect sector to be unusable, when a logical address is mapped to a physical address after the defect scan, so-called skip processing may be executed. In the skip processing, the logical address is not mapped to the physical address of the defect sector but is allocated to the physical address of a sector subsequent to the defect sector. Alternatively, to set the defect sector to be unusable, so-called replacement processing may be executed. In the replacement processing, use of the defect sector is avoided by preparing a spare region in the storage medium, mapping a logical address which should be mapped to the physical address of the defect sector to a physical address of a normal sector in the spare region instead and using the normal sector in the spare region instead of the defect sector. Even if several defect sectors are included in the storage medium, the storage device may be shipped as a conforming item by using the defect scan.

As the storage capacity increases, the time required for the defect scan increases and the entire manufacturing process time also increases.

Such defect scan may be executed not only for the storage device having the magnetic disk, but also for a storage device having semiconductor memory such as a solid state drive (SSD), etc.

BRIEF DESCRIPTION OF THE DRAWINGS

FIG. 3 is a flowchart showing a flow of a process carried out by a main controller of the hard disk drive according to the first embodiment.

FIG. 5A, FIG. 5B, FIG. 5C, and FIG. 5D schematically illustrate data in physical address region and logical address region, during a defect scan performed in a second embodiment.

DETAILED DESCRIPTION

Figure 1:
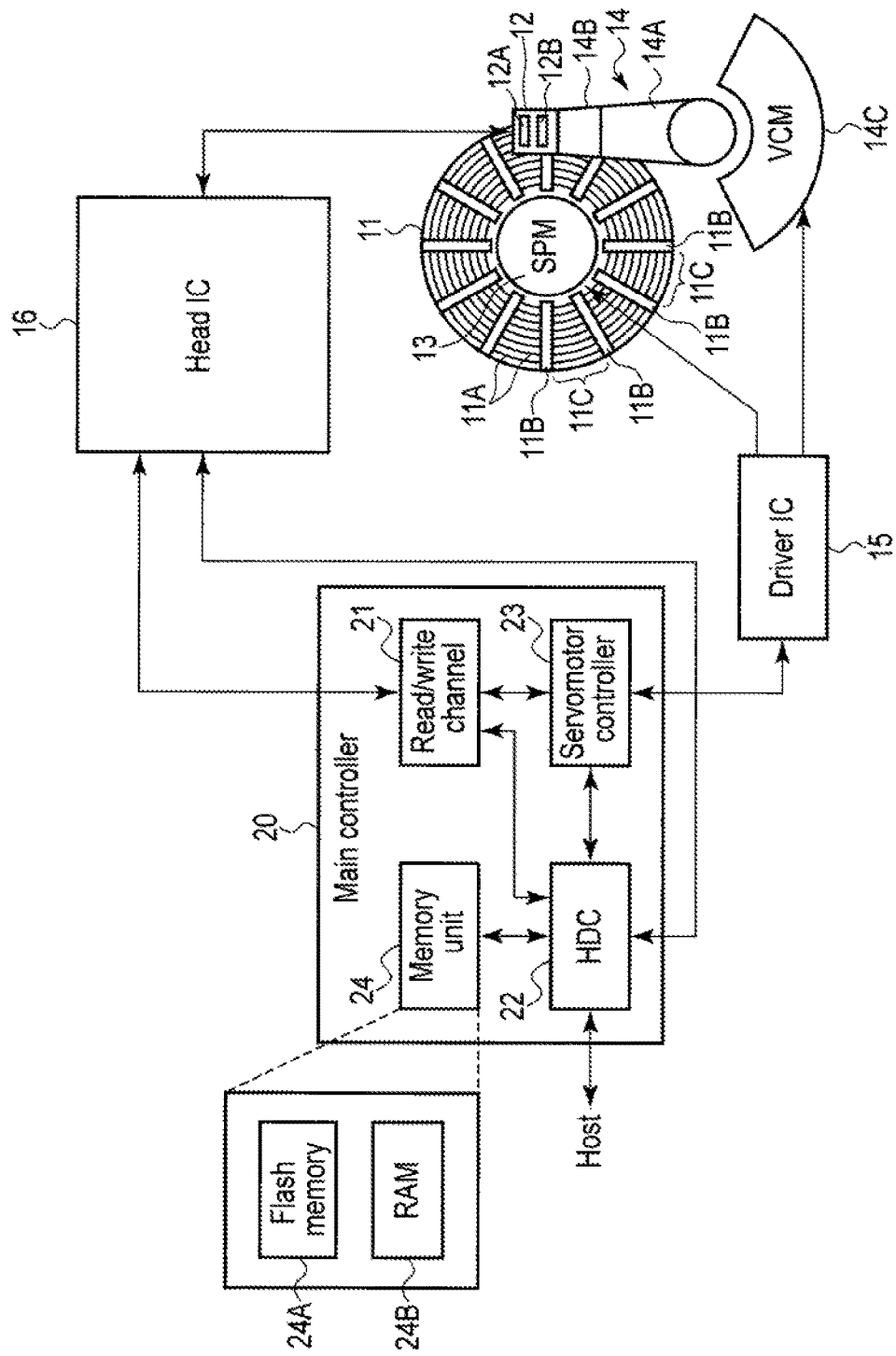
FIG. 1 is a block diagram of a hard disk drive according to a first embodiment.

Various embodiments will be described hereinafter with reference to the accompanying drawings. The drawings and the associated descriptions are provided to illustrate the embodiments and not to limit the scope of the invention.

In general, according to an embodiment, a defect scan method is carried out to detect a defective portion in a storage medium of a storage device, the storage medium including multiple storage regions including a first storage region and a second storage region. The defect scan method includes scanning a part of the storage regions of the storage medium to detect a defective portion therein, before the storage device is connected to a host, a scanned storage region including the first storage region and a non-scanned storage region including the second storage region, mapping logical addresses to physical addresses of a non-defective portion of the first storage region, scanning the second storage region to detect a defective portion therein, after the storage device is connected to the host, and mapping logical addresses to physical addresses of a non-defective portion of the second storage region.

In general, a defect scan is executed for an entire region of a storage medium during an inspection process before shipment. According to one or more embodiments, however, the defect scan is executed for a part of the region of the storage medium during the inspection process before shipment, and the defect scan for the remaining region is executed after shipment. As a result, the inspection time before shipment can be reduced. Data are rarely written to the entire region of the storage medium immediately after shipment. In addition, a data read operation or a data write operation is not executed continuously for twenty-four hours. Instead, the data read operation and the data write operation are executed as needed. That is, there is an idle time during which the data read or data write operation is not executed. The defect scan can be executed during this idle period. In other words, the defect scan for "a certain region" of the storage medium does not need to be executed before shipment, and may be executed until the data are first written to "the certain region".

The storage device includes a correspondence table for mutually translating physical addresses indicating physical positions on the medium into and from logical addresses managed by the host or used by an application of the host. The host rarely writes the data with random logical addresses, and often writes the data sequentially while changing logical addresses under a certain rule, for example, sequentially increasing the logical addresses. For this reason, the defect scan for a region in which the logical addresses are 0 to a predetermined address, for example, a logical address corresponding to approximately one third of the maximum physical address is executed in accordance with a test program before shipment. The test program is executed to perform adjustment of the read/write channels, servo adjustment, TPI/BPI adjustment, etc., besides the defect scan. The storage device is shipped after the defect scan for a partial region is ended, and defect scan for the remaining region may be executed during an appropriate period, for example, the idle period after the shipment. The time required for the defect scan before shipment can be thereby shortened.

The size and position of the region for which the defect scan before shipment is executed may be determined based on a request for the manufacturing time (short time request), prediction of a write condition after shipment, frequency prediction in the idle period, etc. For example, the region is not limited to a region including logical address 0, but may be a region including the maximum value of the logical addresses or a region including a logical address of the middle value between 0 and the maximum value. In addition, the defect scan for not only one region in which the physical addresses are sequential, but also a plurality of regions may be executed before shipment.

First Embodiment

FIG. 1 is a block diagram of a hard disk drive according to a first embodiment. The hard disk drive includes a disk 11, a spindle motor (SPM) 13, an actuator 14, a driver IC 15, a head IC 16, a main controller 20, and etc. The main controller 20 is connected to a host device (not shown and hereinafter simply called a host).

The disk 11 is a magnetic recording medium, which includes a write surface for magnetically recording data. The disk 11 is rotated at a high speed by the spindle motor 13. The spindle motor 13 is driven by a current (or a voltage) supplied from the driver IC 15.

The write surface of the disk 11 includes, for example, a plurality of concentric tracks 11A. Alternatively, the disk may include one spiral track. The disk 11 also includes a plurality of servo areas 11B extending in a radial direction and discretely arranged at regular intervals in a circumferential direction. An area located between adjacent servo areas 11B in each track 11A is used as a data area 11C. The servo area 10B in each track 11A is also called a servo frame. An area formed of the servo area 11B and the data area 11C adjacent to the servo area 11B, in each track 11A, is also called a servo sector. The data area 11C includes a plurality of data sectors of a certain size, for example, 512 bytes.

Servo data and repeatable runout (RRO) correction data are written in the servo area 11B. The RRO correction data is used to correct an error of the servo data caused by misalignment of a center line of the track along which the servo data are written from a perfect circle. At the positioning of the head, the servo data are corrected based on the RRO correction data and the head is positioned at the target track in accordance with the corrected servo data.

A write head 12A and a read head 12B are arranged so as to correspond to the write surface of the head 11. The write head 12A and the read head 12B are attached to a slider 12 disposed at a tip of a suspension 14B extending from an arm 14A of the actuator 14. The actuator 14 is driven by a voice coil motor (VCM) 14C. The voice coil motor 14C is driven by a current (or a voltage) supplied from the driver IC 15. The write head 12A and the read head 12B move on the disk 11 in a radial direction of the disk 11 so as to draw a circular arc, by driving the actuator 14 by the voice coil motor 14C.

The hard disk drive including the single disk 12 is explained with reference to FIG. 1, but a plurality of disks may be stacked. The disk 11 including the write surface on one of the surfaces thereof is described with reference to FIG. 1, but write surfaces may be provided on both surfaces of the disk 11 and a pair of heads may be arranged to face the respective write surfaces.

The driver IC 15 drives the spindle motor 13 and the voice coil motor 14C under control of a servo controller 23 in the main controller 20.

The head IC 16 is also called a head amplifier, and includes a variable gain amplifier (VGA) which amplifies a signal read by the read head 12B (i.e., the read signal). The head IC 16 converts write data output from the main controller (more specifically, a read/write channel 21 in the main controller 20) into a write current and outputs the write current to the write head 12A.

The main controller 20 is implemented by a system LSI in which a plurality of elements are integrated on a single chip. The main controller 20 includes the read/write channel 21, a hard disk controller (HDC) 22, the servo controller 23, and a memory unit 24.

The read/write channel 21 processes signals related to read and write operations on the disk 11. For example, the read/write channel 21 converts a read signal amplified by the head IC 16 into digital data, and decodes read data from the digital data. The read/write channel 21 extracts servo data from the digital data. The read/write channel 21 produces a servo sector timing signal, based on the extracted servo data. The servo sector timing signal corresponds to a servo sector including the servo areas 11B in which the extracted servo data are written (more specifically, the data areas 11C in the servo sector including the servo areas 11B). The read/write channel 21 encodes write data transferred from the hard disk controller 22, and transfers the encoded write data to the head IC 16.

The hard disk controller 22 is connected to the host via a host interface (storage interface). The host uses the hard disk drive as its own storage device. The host and the hard disk drive are built into an electronic device such as a personal computer, a video camera, a music player, a mobile terminal, a mobile phone, or a printer device. The hard disk controller 22 functions as a host interface controller which transfers a signal to the host and receives a signal transferred from the host. More specifically, the hard disk controller 22 receives commands (a write command, a read command, and the like) transferred from the host. The hard disk controller 22 controls data transfer between the host and the memory unit 24. The hard disk controller 22 also functions as a disk interface controller which controls writing of the data to the disk 11 and reading of the data from the disk 11, via the read/write channel 21, the head IC 16, the write head 12A, and the read head 12B.

The servo controller 23 controls the spindle motor 13 and the voice coil motor 14C via the driver IC 15. For positioning of the head 12 to a target position of the target track on the disk 11, the servo controller 23 controls the voice coil motor 14C, based on servo data extracted by the read/write channel 21. Control of the voice coil motor 14C is equivalent to control of the rotational angle of the actuator 14.

Each of the hard disk controller 22 and the servo controller 23 includes a microprocessor unit (MPU; not shown). The MPUs implement functions of the hard disk controller 22 and the servo controller 23 by executing control programs for the hard disk controller 22 and the servo controller 23. These control programs are stored in the flash memory 24A. A single MPU may execute the control programs by time division.

The memory unit 24 includes the flash memory 24A and a RAM 24B. The flash memory 24A is rewritable nonvolatile semiconductor memory. A control program (firmware) configured to implement functions of the main controller 20 including the hard disk controller 22 and the servo controller 23 is pre-stored in a part of a storage area in the flash memory 24A. The control programs include a program for controlling a defect scan before and after shipment. A correspondence table of the logical addresses and the physical addresses, and information on the status of the defect scan (physical addresses, logical addresses, etc., indicating a defect scan completion area) are also stored in another part of the storage area of the flash memory 24A. At least a part of a storage area of the RAM 24B is used as a work area for the hard disk controller 22 and the servo controller 23. The memory unit 24 is built in the main controller 20 in FIG. 1, but the memory unit 24 may be integrated in a chip different from the chip of the main controller 20.

Summary of the defect scan according to the first embodiment will be described with reference to FIG. 2A, FIG. 2B, and FIG. 2C. Since one hard disk drive may include a plurality of magnetic disks, the sector position is specified by the physical address including the cylinder number, the head number, and the sector number. The cylinder is a cylindrical area formed of a plurality of regions having the same track numbers, and the cylinder number identifies the track. The head number identifies the disk including the write surface used. The physical address of the storage medium (disk) in the hard disk drive is assumed to have the minimum value represented by 0 and the maximum value represented by $PBA_{max}$.

In the manufacturing process before shipment, the main controller 20 executes write/read tests of each sector and operates to detect an unreadable defect sector, while sequentially increasing the physical address from 0, based on a defect scan program stored in the flash memory 24A. The main controller 20 registers the physical address of the defect sector in a defect list stored in the flash memory 24A.

The main controller 20 executes the defect scan while increasing the physical address and, if the physical address becomes a predetermined address, the main controller 20 ends the defect scan. The predetermined address is, for example, approximately one third of the maximum value $PBA_{max}$ of the physical address. The main controller 20 skips mapping of the logical addresses to the physical address of the defect sector and does not map the logical address to the physical address of the defect sector, so as to prevent the defect sector from being used when the logical address is mapped to the physical address after the defect scan. When the defect scan of this area is ended, the hard disk drive is shipped. The manufacturing process before shipment is thereby shortened.

Figures 2A, 2B, 2C:
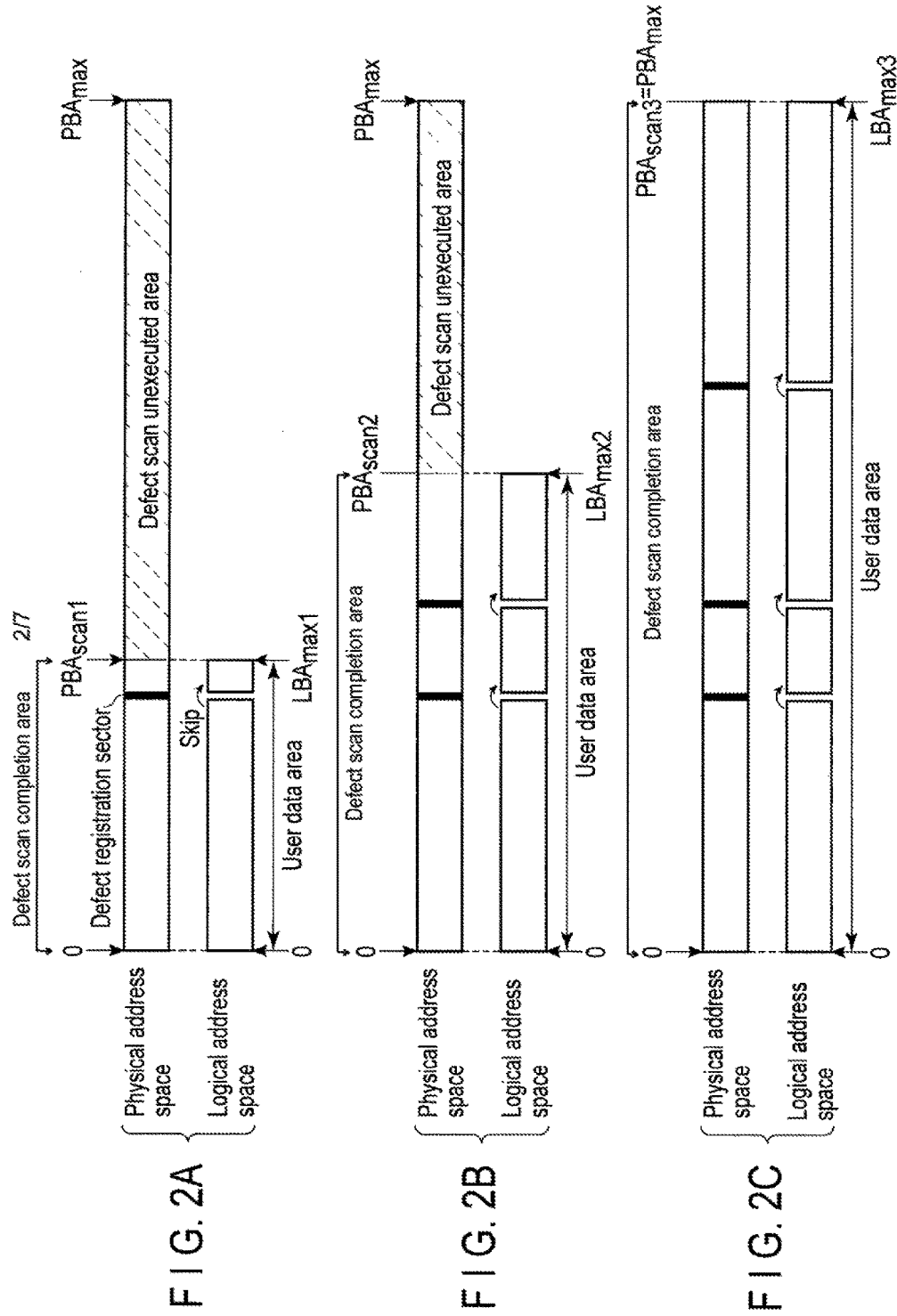
FIG. 2A, FIG. 2B, and FIG. 2C schematically illustrate data in physical address region and logical address region, during a defect scan performed in the first embodiment.

The physical address space and the logical address space at shipment are schematically illustrated in FIG. 2A. The maximum value of the physical addresses in the defect scan completion area at this time is represented by $PBA_{scan1}$. $PBA_{scan1}$ is, for example, approximately one third of the maximum value $PBA_{max}$ of the physical addresses. The main controller 20 maps logical addresses 0 to $LBA_{max1}$ to the defect scan completion area of physical addresses 0 to $PBA_{scan1}$. Since the main controller 20 does not map the logical address to the physical address of the defect sector, in the present embodiment, the maximum value $LBA_{max1}$ of the logical addresses becomes smaller than the maximum value $PBA_{scan1}$ of the physical addresses in the defect scan completion area if the defect sector is present. The logical addresses are mapped to the physical addresses 0 to $PBA_{scan1}$ for which the defect scan has been completed, and this area is a user data area which the host can access. The defect list including the physical address of the defect sector is stored in the flash memory 24A. The maximum values of the (physical and logical) addresses in the defect scan completion area are also stored in the flash memory 24A.

Thus, the maximum value $LBA_{max1}$ of the logical addresses in the user data area at shipment is often different for each disk (write surface) due to the defect sector.

Recently, a storage system such as a data center having a number of hard disk drives often does not adopt a RAID configuration, and storage capacity of the hard disk drives in the storage system may be different.

The main controller 20 executes the defect scan in the defect scan unexecuted area during the idle period after shipment. The defect scan is executed sequentially from a sector adjacent to the defect scan completion area, in the defect scan unexecuted area, i.e., a sector of the next physical address greater than the physical address $PBA_{scan1}$. FIG. 2B illustrates the physical address space and the logical address space in a state in which the defect scan has been completed in the middle of the defect scan unexecuted area. At this time, a maximum value $PBA_{scan2}$ of the physical addresses in the defect scan completion area and a logical address $LBA_{max2}$ corresponding to the maximum value $PBA_{scan2}$ of the physical addresses are greater than $PBA_{scan1}$ and $LBA_{max1}$ shown in FIG. 2A. In this case, too, the maximum value of the logical address $LBA_{max2}$ may be smaller than the corresponding physical address $PBA_{scan2}$, by the value of the defect sector.

Furthermore, when the defect scan advances during the idle period and the defect scan of the maximum physical address $PBA_{max}$ has been completed, the entire physical address area (except the defect sector) of the storage medium becomes the user data area as shown in FIG. 2C. The logical addresses of the user data area are 0 to $LBA_{max3}$.

When the host supplies an inquiry command to the drive, the drive returns the maximum value $PBA_{max}$ of the physical addresses and the maximum value $PBA_{scan}$ of the physical addresses in the defect scan completion area, to the host. The host is capable of knowing $LBA_{max}$ mapped to $PBA_{scan}$ and the logical address range of the user data area, and further knowing a remaining capacity in which write can be executed by subtracting the maximum value of the physical addresses of the written area from $PBA_{scan}$. When a hard disk drive including a plurality of magnetic disks is used or a system using a plurality of hard disk drives is applied, if data are written in a disk/drive having a large remaining capacity with higher priority than a disk/drive having a small remaining capacity, the idle period of the disk/drive having a small remaining capacity is increased and the defect scan of the disk/drive can be advanced. Thus, when data are written in a disk/drive even if the defect scan of the entire area is not completed at shipment, the possibility that the defect scan is not executed at the disk/drive and write cannot be executed is reduced.

FIG. 3 is a flowchart showing a flow of process carried out in the main controller 20 after shipment. The process shown in FIG. 3 is executed in the background while the power of the hard disk drive is turned on. In step 102, the main controller 20 determines whether or not the command of read or write has been received from the host. If the command has been received (Yes in step 102), the main controller 20 executes the process according to the command in step 104, and the process returns to step 102.

If the command has not been received (No in step 102), the main controller 20 determines whether or not a certain period has elapsed after reception of the last command, in step 106. If the certain period has not elapsed (No in step 106), the process returns to step 102.

If the certain period has elapsed (Yes in step 106), the idle period is considered to start, and the main controller 20 starts the defect scan in step 108. The defect scan is executed at a sector of the next physical address greater than the maximum value ($PBA_{scan1}$ at shipment) of the physical addresses in the defect scan completion area. After the scan of one sector is finished, the physical address is increased and following sectors are scanned sequentially. The defect scan continues until a next command is received from the host. For this reason, the main controller 20 determines whether or not a command has been received from the host, in step 110. If the command has not been received (No in step 110), the process returns to step 110, and the controller 20 continues the defect scan.

When the command is received from the host (Yes in step 110), the main controller 20 ends the defect scan in step 112. The logical address is mapped to the physical address of the sector in which the defect scan is ended. At this time, the mapping of the logical address to the physical address of the defect sector is skipped.

The defect scan completion state of step 112 is assumed to be the state shown in FIG. 2B. The main controller 20 updates the maximum value $PBA_{scan}$ of the physical addresses in the defect scan completion area and the logical address $LBA_{max}$ corresponding to the maximum value $PBA_{scan}$ of the physical addresses in the defect scan completion area to $PBA_{scan2}$ and $LBA_{max2}$, respectively. The main controller 20 stores the addresses and a correspondence table of the logical address/physical address at that time in the flash memory 24A.

In step 114, the main controller 20 executes a process corresponding to the received command from the host in step 110. In step 116, the main controller 20 determines whether or not an end instruction has been received. The main controller 20 ends the process if the end instruction has been received (Yes in step 116), or repeats the process following step 102 if no end instruction has been received (No in step 116). Thus, when a period during which a command is not received from the host is a certain period, the defect scan is executed until a command is received, i.e., during the idle period. For this reason, the storage device can be shipped without executing the defect scan of the entire area in the storage medium, and the manufacturing process can be shortened.

Figure 4:
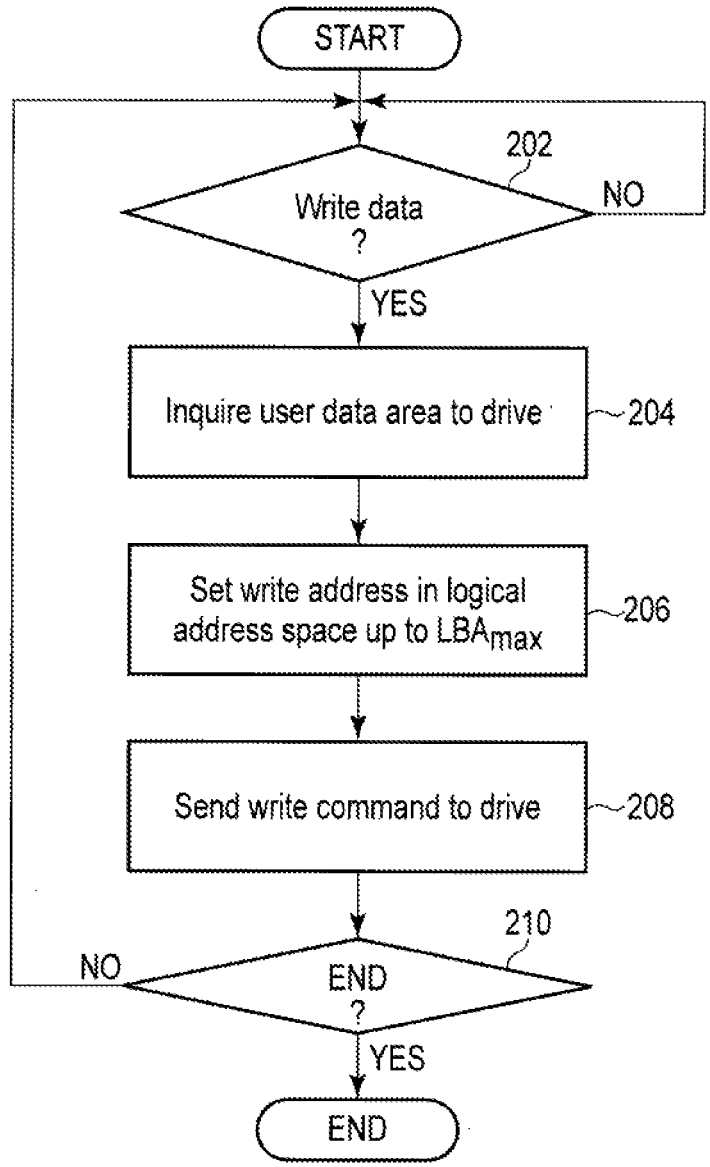
FIG. 4 is a flowchart showing a flow of a process carried out by a host in the first embodiment.

FIG. 4 is a flowchart showing a flow of a process carried out in the host. The process shown in FIG. 4 is also executed in the background while the power of the host is turned on. In step 202, the host determines whether or not write data which should be written to the hard disk drive is present. If the write data is present, the host transmits to the hard disk drive a command to inquire the maximum value $PBA_{scan}$ of the physical addresses of the user data area and the maximum value $PBA_{max}$ of the physical addresses of the entire area of the disk, in step 204. In response to the command, the hard disk drive returns $PBA_{scan}$, $PBA_{max}$ and logical addresses corresponding to the maximum values to the host.

The host can access the only area in which the defect scan has been completed. For this reason, the host sets the write address (logical address) to an address less than or equal to the logical address $LBA_{max}$ allocated to the maximum physical address $PBA_{scan}$ of the defect scan completion area in step 206. The host sends the write command (i.e., the write data and the write address) to the drive in step 208. In the drive, the write command is executed and the data is written to the sector of the physical address corresponding to the write address (logical address) in step 104 or step 114 shown in FIG. 3. The host determines whether the processing for the drive has ended or not, in step 210. If the processing has not ended, the flow returns to step 202.

According to the present embodiment, an inspection process can be shortened by executing the defect scan only for a part of the region before the shipment and the defect scan for the remaining region during the idle period after the shipment. Since the host sets the logical address of the area for which the defect scan has been completed as the write address in which data are to be written, no problems are likely to occur even if the defect scan of the entire region is not completed at the write operation. Since the storage capacity of the hard disk drive becomes a capacity of the area for which the defect scan has been completed, the user data area is increased as time passes. Also, the ratio of the area for which the defect scan has been completed to the entire area of the storage medium increases as time passes.

In general, the defect sector registered as having defect is replaced, and a part of the entire area (for example, approximately 2% of the entire area) is preliminarily secured as a spare area for the replacement. If the total size of the defect sector is greater than or equal to the spare area, the drive is not shipped as being a defective product. Even if the number of defect sectors detected is small and the spare area remains, the remaining area may be left as an unused area and the recording area may be wasted. According to the present embodiment, since the defect sector is skipped, the user data area is the area obtained by subtracting the total size of the defect sector from the entire physical address space. Although the size of the spare area may be different in each drive, the spare area is not wasted.

The area where the defect scan has been executed before shipment is the area where the physical address is from 0 to approximately one third of the maximum value in the present embodiment, but this area can be freely set in accordance with various circumstances. For example, when the idle time is long or the amount of the data to be written is small, the area may be smaller than this area, for example, may be an area where the physical address is from 0 to approximately one eighth of the maximum value or may not be an area including logical address 0.

Second Embodiment

A defect scan according to a second embodiment will be described with reference to FIG. 5A, FIG. 5B, FIG. 5C, and FIG. 5D. The entire configuration of the hard disk drive is the same as the one according to the first embodiment shown in FIG. 1. As shown in FIG. 2A, the area subjected to the defect scan before shipment in the first embodiment is an area where physical addresses 0 to $PBA_{scan1}$ are sequential, and the user data area corresponds to the area of the physical addresses 0 to $PBA_{scan1}$. In contrast, two areas are subjected to the defect scan before shipment, in the second embodiment. As shown in FIG. 5A, there are a first defect scan completion area of the physical addresses 0 to $PBA_{scan1}$ and a second defect scan completion area of the physical addresses $PBA_{scan-end1}$ to $PBA_{max}$ at shipment. In other words, the entire area of the storage medium at shipment includes a defect scan unexecuted area of physical addresses $PBA_{scan1}$ to $PBA_{scan-end1}$ and two defect scan completion areas located on both sides of the defect scan unexecuted area. The first and second defect scan completion areas may include the physical addresses 0 and $PBA_{max}$, respectively. Further, the first defect scan completion area may be larger than the second defect scan completion area, and the sizes may be arbitrary.

In the first embodiment, the user data area at shipment is the area of the logical addresses 0 to $LBA_{max1}$ corresponding to the area of the physical addresses 0 to $PBA_{scan1}$ where the defect scan has been completed. In the second embodiment, the user data area at shipment is a range of the logical addresses 0 to $LBA_{max}$ corresponding to the entire range of physical addresses. For this reason, if the host writes the data after shipment, the write address can be the logical addresses 0 to $LBA_{max}$.

When the host writes data after shipment, if the write address is within the logical address range corresponding to the physical addresses $PBA_{scan1}$ to $PBA_{scan\text{-}end1}$, which is the defect scan unexecuted area, as shown in FIG. 5B, the logical address of a sector part A in which the data should be written is reallocated. In other words, the logical address of the sector part A has been mapped to the physical address which is the defect scan unexecuted area, but is remapped to the physical address in the second defect scan completion area.

When the host writes the data, if the write address is within the logical address range corresponding to the second defect scan completion area, the logical address is not remapped but the data are written to the address. The hard disk drive is configured to record an area where the host writes the data. If the address used to write the data is the user data area, the hard disk drive excludes the address from an area for the write to the defect scan unexecuted area, which is the inherent object of the second defect scan completion area. Alternatively, the hard disk drive may prohibit the host to access this area to prevent the write address from becoming the logical address range corresponding to the second defect scan completion area, and may cause the entire area to be accessible from the host if the defect scan of the entire area has been completed.

Similarly, if the write address corresponds to sector part B within the logical address range corresponding to the area of physical addresses $PBA_{scan1}$ to $PBA_{scan\text{-}end1}$, which is the defect scan unexecuted area, the logical address of the sector part B is remapped to the physical address in the second defect scan completion area.

For this reason, according to the second embodiment, the user data area (i.e., the range in which the write address can be allocated) after shipment is extended as compared with the first embodiment. If the size of the write data is less than or equal to the size of the remaining writable space of the second defect scan completion area, the data can be definitely written.

The defect scan of the defect scan unexecuted area is started if the idle period has come. The defect scan is executed sequentially for sectors of smaller physical addresses of the unexecuted area in the first embodiment, but the defect scan is executed in the following manner in the second embodiment. If the write command as shown in FIG. 5B is not executed before the idle period, the defect scan is executed sequentially in sectors of smaller physical addresses in the unexecuted area. If the write command to an address corresponding to the defect scan unexecuted area is received, the write address is remapped to the physical address of the second defect scan completion area and the remaining writable space of the second defect scan completion area is reduced, as shown in FIG. 5B, before the idle period. Then, the defect scan is executed sequentially in sectors of higher physical addresses of the defect scan unexecuted area adjacent to the second defect scan completion area to secure the remaining amount of the second defect scan completion area as shown in FIG. 5C.

FIG. 5C shows an address space when the defect scan is executed so as to expand the second defect scan completion area.

After that, the defect scan is executed again with respect to a next idle period. However, if the write command is not issued to the logical address corresponding to the defect scan unexecuted area before the next idle period, the defect scan is executed sequentially in sectors of smaller physical addresses of the unexecuted area as shown in FIG. 5D. Here, as shown in FIG. 5D, if there is a defect in the scanned area, the mapping of the logical address to the physical address corresponding to the defect is updated, such that no logical address is mapped to the physical address.

Figure 6:
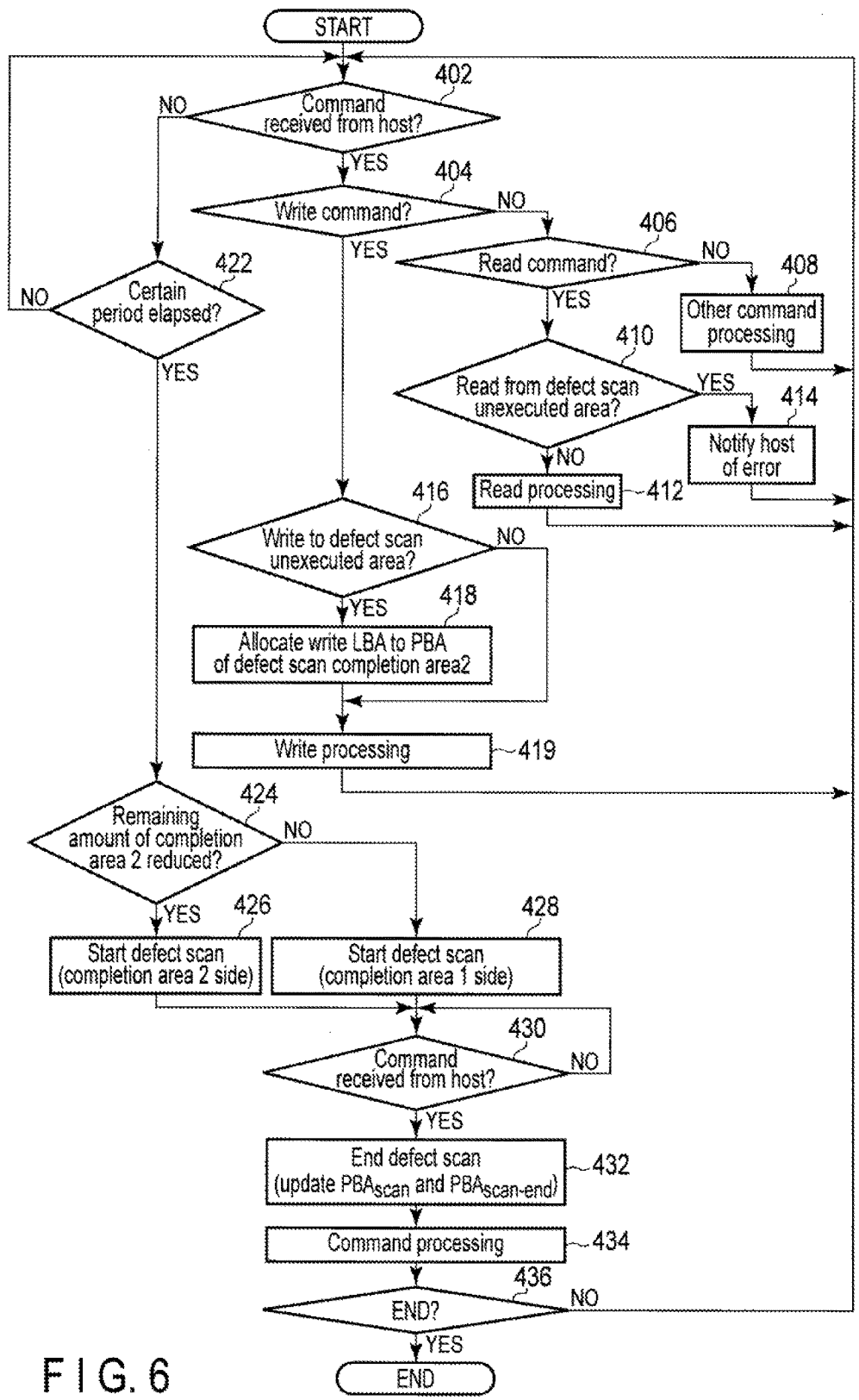
FIG. 6 is a flowchart showing a flow of a process carried out by a main controller of a hard disk drive according to the second embodiment.

FIG. 6 is a flowchart showing a flow of a process carried out by the main controller 20 after shipment.

In step 402, the main controller 20 determines whether or not a command has been received from the host. If the command has been received (Yes in step 402), the main controller 20 determines whether or not the received command is a write command, in step 404. If the received command is not the write command (No in step 404), the main controller 20 determines whether or not the received command is a read command in step 406. If the received command is not the read command (No in step 406), the main controller 20 executes another command processing in step 408, and then the process returns to step 402.

If the received command is the read command (Yes in step 406), the main controller 20 determines whether or not the read address is a logical address corresponding to the defect scan unexecuted area, i.e., whether or not the data are read from the defect scan unexecuted area, in step 410. If the read address is a logical address corresponding to the defect scan unexecuted area, the controller 20 notifies the host of an error of access to an area other than the defect scan completion area in step 414. If the read address is not a logical address corresponding to the defect scan unexecuted area (No in step 410), the controller 20 executes the read process in step 412, and then the process returns to step 402.

If the received command is the write command (Yes in step 404), the main controller 20 determines whether or not the write address is a logical address corresponding to the defect scan unexecuted area, i.e., whether or not the data are written to the defect scan unexecuted area, in step 416. If the write address is not a logical address corresponding to the defect scan unexecuted area (No in step 416), the main controller 20 executes the write process with respect to the physical address corresponding to the logical address designated by the write command, in step 419.

If the write address is a logical address corresponding to the defect scan unexecuted area (Yes in step 416), the main controller 20 remaps the write address (logical address) to the physical address of the second defect scan completion area as shown in FIG. 5B, in step 418. The main controller 20 executes the write process with respect to the physical address of the second defect scan completion area, in step 419.

The main controller 20 executes the determination of command reception of step 402 again after the write process in step 419.

If the command is not received (No in step 402), the main controller 20 determines whether or not a certain period has elapsed after reception of the last command, in step 422. If a certain period has not elapsed (No in step 422), the process returns to step 402.

If a certain period has elapsed (Yes in step 422), the idle period is considered to start, and the main controller 20 determines whether or not a free space of the second defect scan completion area is reduced as shown in FIG. 5B, in step 424. If a free space is not reduced (No in step 424), the main controller 20 executes the defect scan sequentially for sectors (on the side of the first defect scan completion area) of smaller physical addresses of the defect scan unexecuted area, in step 428, similarly to the first embodiment. If a free space is reduced (Yes in step 424), the main controller 20 executes the defect scan sequentially for sectors (on the side of the second defect scan completion area) of higher physical addresses of the defect scan unexecuted area, in step 426.

Then, the main controller 20 determines whether or not a command has been received from the host, in step 430. If a command has not been received (No in step 430), the process returns to step 430, and the main controller 20 continues the defect scan.

When a command is received from the host (Yes in step 430), the main controller 20 ends the defect scan in step 432. The defect scan completion state of step 432 is assumed to be the state shown in FIG. 5C. The main controller 20 updates the minimum value $PBA_{scan}$ and the maximum value $PBA_{scan-end}$, of the physical addresses of the defect scan unexecuted area. The main controller 20 stores the addresses and a correspondence table of the logical address/physical address of this time in the flash memory 24A.

In step 434, the main controller 20 executes a process according to the command received from the host. In step 436, the main controller 20 determines whether or not an end instruction has been received. The main controller 20 ends the process, if the end instruction has been received (Yes in step 436). The process returns to step 402 if no end instruction has been received (No in step 436).

According to the second embodiment, the inspection process before shipment can be shortened by executing the defect scan for two areas before shipment and then executing the defect scan for the remaining area during the idle period after shipment. If, the logical address of the write command received after shipment is mapped to the physical address of the defect scan unexecuted area, the write address (logical address) is remapped to the physical address in either of the two defect scan completion areas and the write command is executed. If the idle period has come and the size of either of the defect scan completion areas is reduced from an initial size, the defect scan is executed so as to expand the defect scan completion area. For this reason, any one of the defect scan completion areas can be maintained in a certain size at any time. Also, even if the address of the write command is in the defect scan unexecuted area, the write command can be executed.

Two areas subjected to defect scan before shipment do not need to be present on both sides of the defect scan unexecuted area. At least two defect scan unexecuted areas may be present and at least one defect scan completion area may be sandwiched between the defect scan unexecuted areas.

Furthermore, the number of areas subjected to the defect scan before shipment is not limited to two but may be one or at least three.

The hard disk drive (HDD) is raised as an example in the above embodiments, but the embodiments can also be applied to a solid state drive (SSD) having nonvolatile semiconductor memory or a hybrid drive of SSD and HDD.

The various modules of the systems described herein can be implemented as software applications, hardware and/or software modules, or components on one or more computers, such as servers. While the various modules are illustrated separately, they may share some or all of the same underlying logic or code.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiment described herein may be made without departing from the spirit of the invention. The accompanying claims and their equivalents are intended to cover such forms or modifications as would fall within the scope and spirit of the inventions.

What is claimed is:

1. A method for detecting a defective portion in a storage medium of a storage device, the storage medium including multiple storage regions including a first storage region and a second storage region, the method comprising:
   scanning the first storage region of the storage medium to detect a defective portion therein, before the storage device is connected to a host;
   mapping logical addresses to physical addresses of the first storage region other than the defective portion, if any; and
   scanning the second storage region of the storage medium to detect a defective portion therein, after the storage device is connected to the host, wherein
   the first storage region includes a first part that ranges continuously from a smallest physical address to a first predetermined physical address, of the storage medium, and a second part that ranges continuously from a second predetermined physical address that is larger than the first predetermined physical address to a largest physical address, of the storage medium, and the second storage region ranges continuously from the first predetermined physical address to the second predetermined physical address, and
   if a logical address designated by the host for data writing is mapped to a physical address of a non-scanned storage region of the second storage region, remapping said logical address to a physical address of a non-defective portion of the first storage region.

2. The method according to claim 1, further comprising:
   if a defective portion is detected in the second storage region, updating a mapping of logical addresses to physical addresses such that no logical address is mapped to a physical address of the defective portion in the second storage region.

3. The method according to claim 1, wherein
   when an unwritten space in the second part of the first storage region is smaller than a certain size, scanning a part of the second storage region that ranges continuously from a third physical address that is between the first and second predetermined physical addresses and the second predetermined physical address.

4. The method according to claim 1, wherein
   the scanning of the second storage region is carried out when a predetermined period of time has passed after a last command was received from the host.

5. The method according to claim 1, wherein
   the scanning of the second storage region is terminated when a read command or a write command is received from the host.

6. The method according to claim 1, wherein
   if the logical address designated by the host for data writing is mapped to the physical address of the non-scanned storage region of the second storage region, said logical address is remapped to a physical address of a non-defective portion of the second part of the first storage region.

7. A storage device, comprising:
   a storage medium including a first storage region that has been subjected to scanning for a defective portion and a second storage region that has not been subjected to the scanning, wherein the first storage region includes a first part that ranges continuously from a smallest physical address to a first predetermined physical address, of the storage medium, and a second part that ranges continuously from a second predetermined physical address that is larger than the first predetermined physical address to a largest physical address, of the storage medium, and the second storage region ranges continuously from the first predetermined physical address to the second predetermined physical address;

a controller configured to access the storage medium in accordance with a command from a host; and a memory unit storing mapping of logical addresses to physical addresses of a non-defective portion of the first storage region and of the second storage region, wherein in response to a write command from the host, if a logical address designated in the write command is mapped to a physical address of the second storage region, remapping said logical address to a physical address of a non-defective portion of the first storage region.

8. The storage device according to claim 7, wherein the storage medium includes a magnetic disk.

9. The storage device according to claim 7, wherein the controller is configured to scan the second storage region when a predetermined period of time has passed after a last command was received from the host.

10. The storage device according to claim 9, wherein if the controller detects a defective portion in the second storage region during the scanning of the second storage region, the controller updates the mapping such that no logical address is mapped to a physical address of the defective portion in the second storage region.

11. The storage device according to claim 7, wherein the controller is further configured to terminate the scanning of the second storage region when a read command or a write command is received from the host.

12. The storage device according to claim 7, wherein the controller is further configured to transmit, to the host, a logical address that is mapped to a largest mapped physical address of the storage medium, or the largest mapped physical address.

13. The storage device according to claim 7, wherein when an unwritten space in the second part of the first storage region is smaller than a certain size, the controller scans a part of the second storage region that ranges continuously from a third physical address that is between the first and second predetermined physical addresses and the second predetermined physical address.

14. The storage device according to claim 7, wherein if the logical address designated in the write command is mapped to the physical address of the second storage region, said logical address is remapped to a physical address of a non-defective portion of the second part of the first storage region.

* * * * *